United States Patent
Lee et al.

(10) Patent No.: US 12,329,047 B2
(45) Date of Patent: Jun. 10, 2025

(54) SEMICONDUCTOR DEVICE INCLUDING RESISTANCE CHANGE LAYER AND METAL PARTICLE-EMBEDDED METAL-ORGANIC FRAMEWORK LAYER AND METHOD OF MANUFACTURING THE SAME

(71) Applicant: SK hynix Inc., Icheon-si (KR)

(72) Inventors: Woo Cheol Lee, Icheon-si (KR); Won Tae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 517 days.

(21) Appl. No.: 17/881,057

(22) Filed: Aug. 4, 2022

(65) Prior Publication Data

US 2023/0292636 A1  Sep. 14, 2023

(30) Foreign Application Priority Data

Mar. 14, 2022 (KR) .......... 10-2022-0031717

(51) Int. Cl.
*H10B 63/00* (2023.01)
*H10N 70/00* (2023.01)

(52) U.S. Cl.
CPC .......... *H10N 70/841* (2023.02); *H10B 63/00* (2023.02); *H10N 70/023* (2023.02)

(58) Field of Classification Search
CPC .............. H10N 70/841; H10N 70/023; H10N 70/8825; H10N 70/24; H10N 70/826; H10N 70/828; H10N 70/8822; H10N 70/8836; H10N 70/881; H10B 63/00; H10B 63/20; H10B 63/80; G11C 2213/55; G11C 13/0007; G11C 13/0014
See application file for complete search history.

(56) References Cited

U.S. PATENT DOCUMENTS

| | | | |
|---|---|---|---|
| 2021/0193585 A1* | 6/2021 | Said | H01L 23/53266 |
| 2021/0193674 A1* | 6/2021 | Said | H10D 30/693 |
| 2021/0325336 A1* | 10/2021 | Ukai | H10K 85/615 |

FOREIGN PATENT DOCUMENTS

| | | | | |
|---|---|---|---|---|
| CN | 103052992 A | * | 4/2013 | ......... G11C 13/0007 |
| CN | 104993047 A | * | 10/2015 | |
| CN | 103270592 B | * | 1/2016 | ......... G11C 11/5685 |
| CN | 107994116 A | * | 5/2018 | |
| CN | 115207026 A | * | 10/2022 | ......... G11C 13/0007 |

* cited by examiner

*Primary Examiner* — S M Sohel Imtiaz

(57) ABSTRACT

A semiconductor device according to an embodiment of the present disclosure includes a first electrode, a first resistance change layer disposed on the first electrode, a conduction control layer disposed on the first resistance change layer, a second resistance change layer disposed on the conduction control layer, and a second electrode disposed on the second resistance change layer. The conduction control layer includes a metal-organic framework layer and metal particles embedded in the metal-organic framework layer.

28 Claims, 20 Drawing Sheets

SEMICONDUCTOR DEVICE INCLUDING RESISTANCE CHANGE LAYER AND METAL PARTICLE-EMBEDDED METAL-ORGANIC FRAMEWORK LAYER AND METHOD OF MANUFACTURING THE SAME

CROSS-REFERENCE TO RELATED APPLICATIONS

The present application claims priority under 35 U.S.C. § 119(a) to Korean Application No. 10-2022-0031717, filed on Mar. 14, 2022 in the Korean Intellectual Property Office, which is incorporated herein by reference in its entirety.

BACKGROUND

1. Technical Field

The present disclosure generally relates to a semiconductor device including a resistance change layer, and a method of manufacturing the same.

2. Related Art

In general, a resistance change material may refer to a material whose electrical resistance changes when an external stimulus, such as heat, current, voltage, or light is applied. The resistance change material may maintain the changed electrical resistance even after the external stimulus is removed. A resistance change memory device utilizes the electrical characteristics of the resistance change material to store signal information.

The resistance change memory device may switch between a low resistance state and a high resistance state through a set operation and a reset operation. According to factors generating a switching operation, the resistance change memory device may be classified into a resistive RAM, a phase change RAM, a magnetic memory, and or the like. Among them, the resistive memory (resistive RAM) may implement resistance states that are differentiated from each other by generating or blocking a low resistance electrical path in the resistance change layer by applying a voltage or current to both ends of the resistance change layer.

SUMMARY

A semiconductor device according to an embodiment of the present disclosure may include a first electrode, a first resistance change layer disposed on the first electrode, a conduction control layer disposed on the first resistance change layer, a second resistance change layer disposed on the conduction control layer, and a second electrode disposed on the second resistance change layer. The conduction control layer may include a metal-organic framework layer and metal particles embedded in the metal-organic framework layer.

There is disclosed a method of manufacturing a semiconductor device according to another embodiment of the disclosure. In the method, a substrate may be provided. A first electrode may be formed on the substrate. A first resistance change layer may be formed on the first electrode. A conduction control layer including an insulating metal-organic framework layer and metal particles embedded in the metal-organic framework layer may be formed on the first resistance change layer. A second resistance change layer may be formed on the conduction control layer. A second electrode may be formed on the second resistance change layer.

A semiconductor device according to another embodiment of the disclosure may include a first conduction line and a second conduction line that are disposed on different planes, and a pillar structure disposed in a region where the first conduction line and the second conduction line intersect. The pillar structure may include a first resistance change layer, a conduction control layer, and a second resistance change layer. The conduction control layer may include a metal-organic framework layer and metal particles embedded in the metal-organic framework layer.

DETAILED DESCRIPTION

Figure 1:
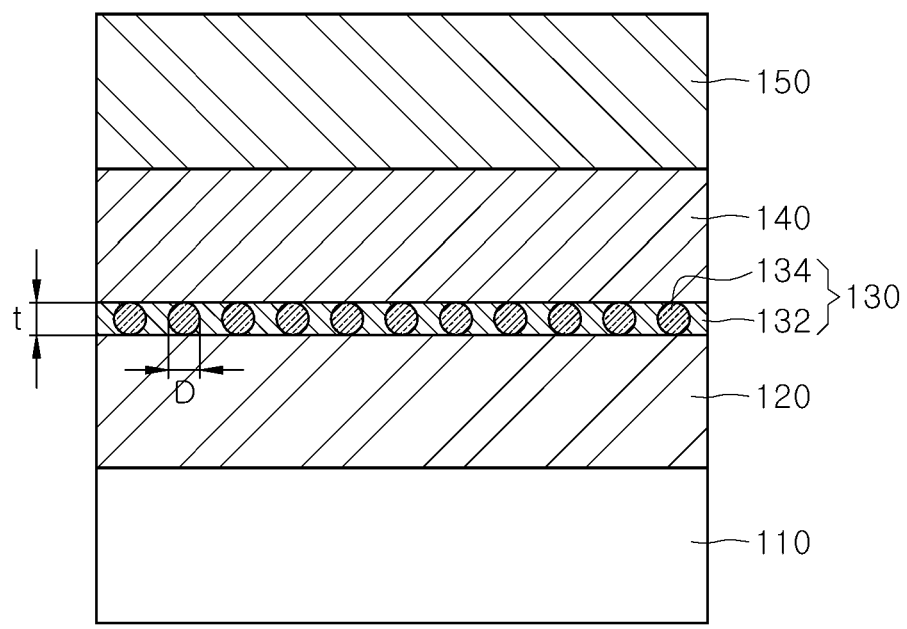
FIG. 1 is a cross-sectional view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. Each process may be performed in the same manner as stated order or may be performed substantially at the same time.

In another example, at least a part of each of the above processes may be performed in a reversed order.

The embodiments of the present disclosure may provide semiconductor devices each including a conduction control layer disposed between a first resistance change layer and a second resistance change layer. The conduction control layer may include a metal-organic framework layer and metal particles embedded in the metal-organic framework layer.

The conductive filaments generated inside the first and second resistance change layers by an operating voltage may be controlled to pass through the metal particles of the conduction control layer. Accordingly, it is possible to control the density and distribution of the conductive filaments by controlling the size and distribution of the metal particles.

According to an embodiment of the present disclosure, by controlling the density and distribution of the conductive filaments through the conduction control layer, uniformity of a set voltage and a reset voltage required for switching the electrical resistance state of a semiconductor device may be improved. As a result, endurance and reliability of the semiconductor device for a set operation and a reset operation may be improved.

Figure 2:
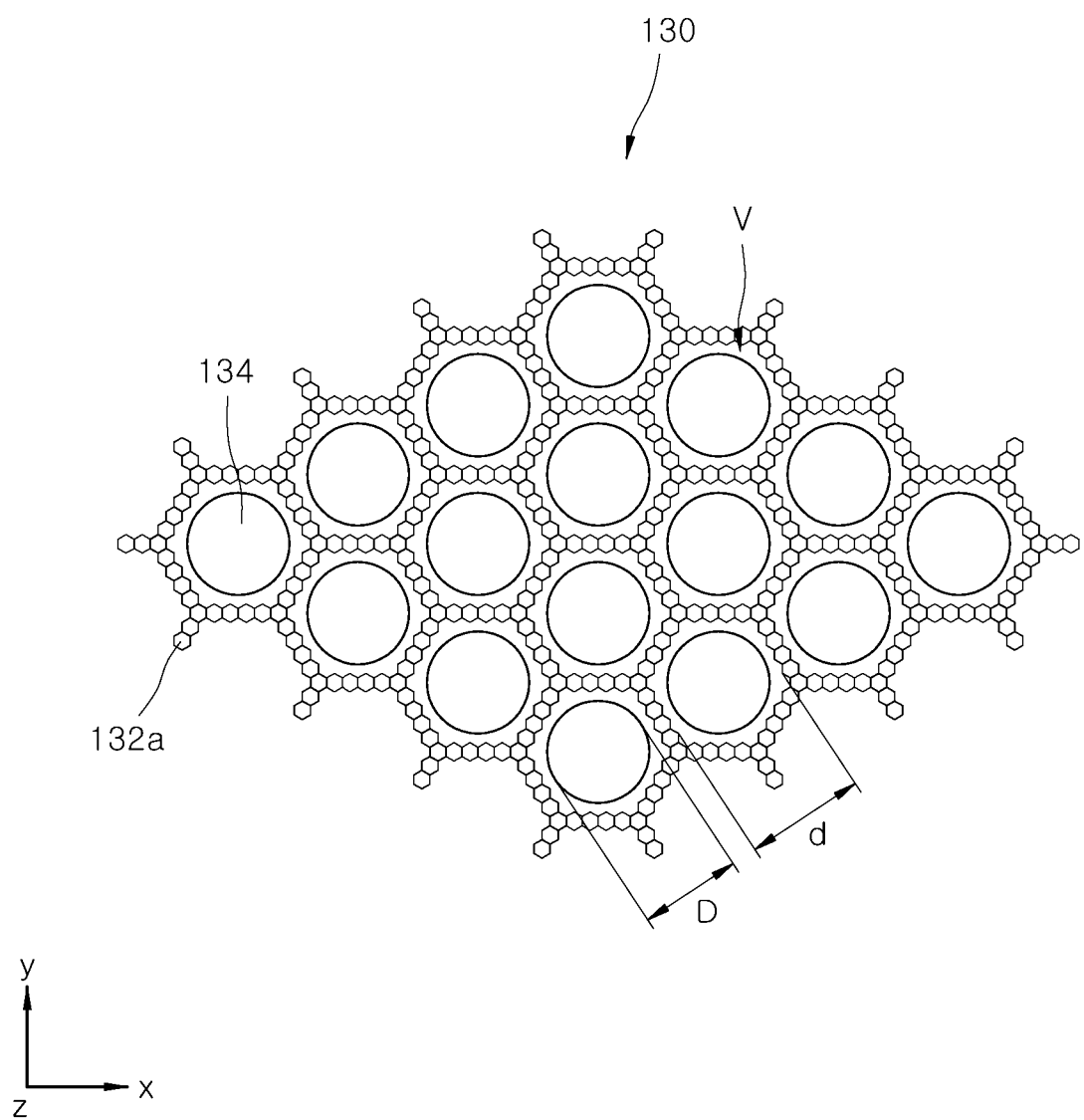
FIG. 2 is a plan view schematically illustrating a conduction control layer of a semiconductor device according to an embodiment of the present disclosure.
Figure 3:
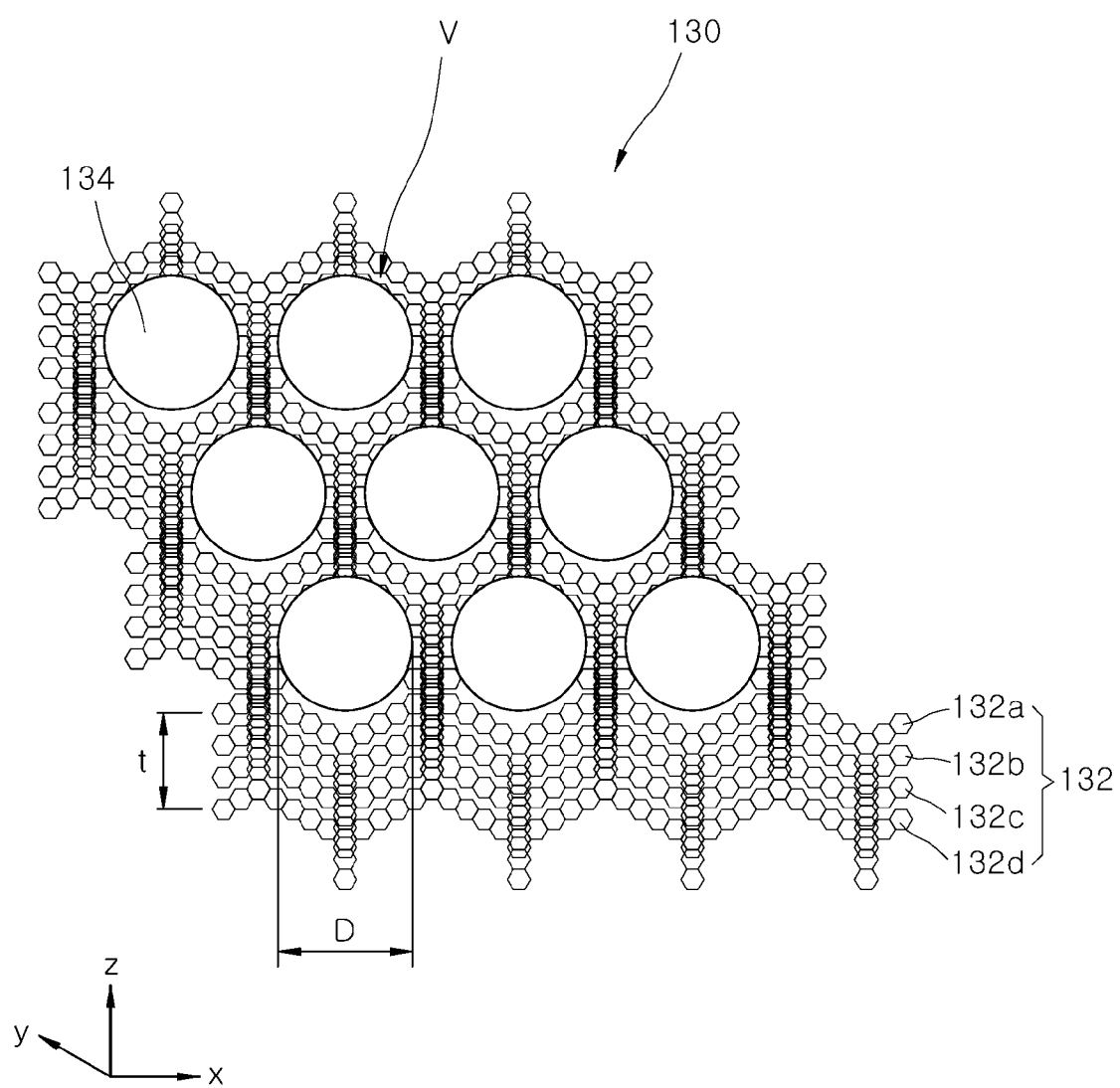
FIG. 3 is a perspective view schematically illustrating a conduction control layer of a semiconductor device according to an embodiment of the present disclosure.
Figure 4:
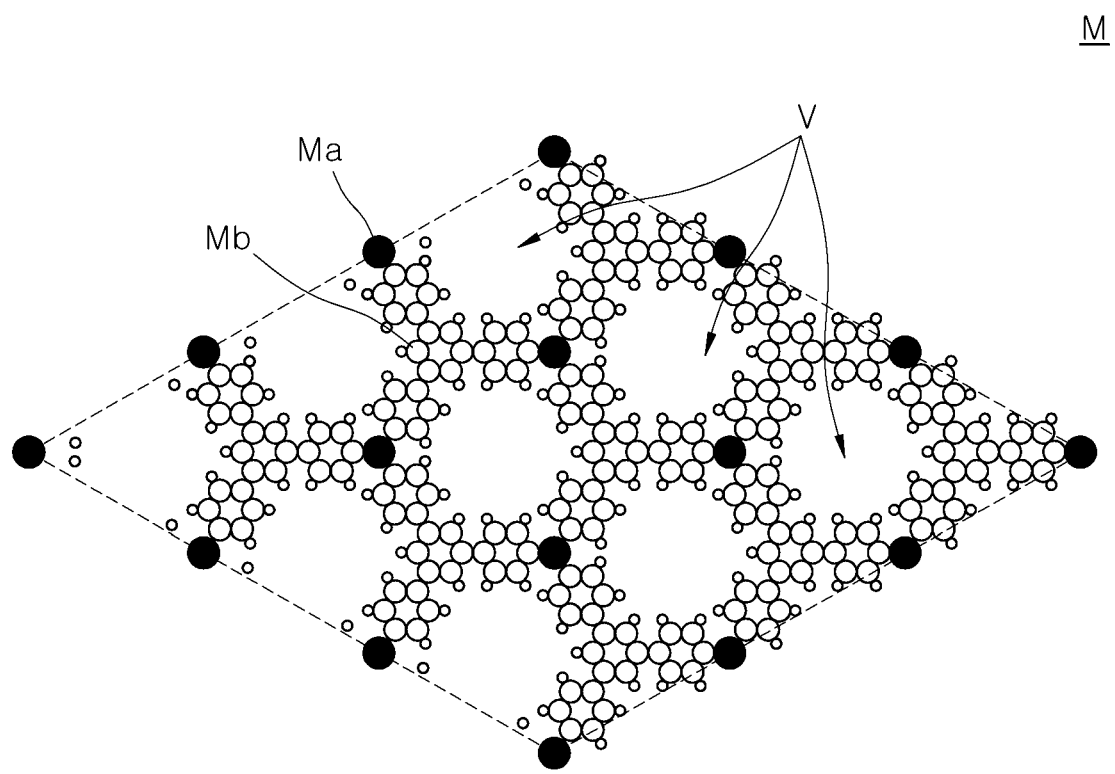
FIG. 4 is a view schematically illustrating a metal-organic framework of a semiconductor device according to an embodiment of the present disclosure.

FIG. 1 is a cross-sectional view schematically illustrating a semiconductor device according to an embodiment of the present disclosure. FIG. 2 is a plan view schematically illustrating a conduction control layer of a semiconductor device according to an embodiment of the present disclosure. FIG. 3 is a perspective view schematically illustrating the conduction control layer of a semiconductor device according to an embodiment of the present disclosure. FIG. 4 is a view schematically illustrating a metal-organic framework of the semiconductor device according to an embodiment of the present disclosure.

Referring to FIG. 1, a semiconductor device 1 may include a first electrode 110, a first resistance change layer 120 disposed on the first electrode layer 110, a conduction control layer 130 disposed on the first resistance change layer 120, a second resistance change layer 140 disposed on the conduction control layer 130, and a second electrode 150 disposed on the second resistance change layer 140. The first electrode 110 and the second electrode 150 may be spaced apart from each other in a first direction (e.g., a z-direction in FIG. 1). The first and second resistance change layers 120 and 140 and the conduction control layer 130 may be disposed between the first electrode 110 and the second electrode 150. The conduction control layer 130 may be disposed between the first resistance change layer 120 and the second resistance change layer 140. In an embodiment, the semiconductor device 1 may be a resistance change memory device in which electrical resistances of the first and second resistance change layers 120 and 140 change according to the arrangement and shape of the conductive filaments formed inside the first and second resistance change layers 120 and 140.

Each of the first electrode 110 and the second electrode 150 may include a conductive material. The conductive material may include, for example, doped semiconductor, metal, conductive metal nitride, conductive metal carbide, conductive metal silicide, or conductive metal oxide. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first and second electrodes 110 and 150 may be made of substantially the same material. Alternatively, the first and second electrodes 110 and 150 may be made of different materials.

Each of the first resistance change layer 120 and the second resistance change layer 140 may include a resistance change material. The resistance change material may include metal oxide, such as titanium oxide, aluminum oxide, nickel oxide, copper oxide, zirconium oxide, manganese oxide, hafnium oxide, tungsten oxide, tantalum oxide, niobium oxide, iron oxide, and the like. As another example, the resistance change material may include a perovskite material, such as $PCMO(Pr_{0.7}Ca_{0.3}MnO_3)$, $LCMO(La_{1-x}Ca_xMnO_3)$, $BSCFO(Ba_{0.5}Sr_{0.5}Co_{0.8}Fe_{0.2}O_{3-\delta})$, $YBCO(YBa_2Cu_3O_{7-x})$, $(Ba,Sr)TiO_3(Cr, Nb$-doped$)$, $SrZrO_3(Cr,V$-doped$)$, $(La, Sr)MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the like. As further another example, the resistance change material may include a selenide-based material, such as $Ge_xSe_{1-x}(Ag,Cu,Te$-doped$)$, or a metal sulfide, such as $Ag_2S$, $Cu_2S$, $CdS$, $ZnS$, and the like.

Meanwhile, as will be described later with reference to FIGS. 5A to 5C, when conductive filaments penetrating the first and second resistance change layers 120 and 140 are formed as a result of an externally applied voltage, the electrical resistances of the first and second resistance change layers 120 and 140 may decrease.

Alternatively, when at least a portion of the conductive filaments is broken or disconnected by an externally applied voltage, the electrical resistances of the first and second resistance change layers 120 and 140 may increase or rise again. The conductive filaments may include oxygen vacancies or metal in the resistance change material.

The conduction control layer 130 may control the shape, density, distribution, arrangement state, etc. of the conductive filaments formed inside the first and second resistance change layers 120 and 140. By controlling the conductive filaments, the conduction control layer 130 may control the density of electrical carriers conducting through the conductive filaments.

The conduction control layer 130 may include a metal-organic framework layer 132 and metal particles 134 embedded in the metal-organic framework layer 132. The metal-organic framework layer 132 may have an electrically insulating property, and the metal particles 134 may have electrical conductivity. Because the metal particles 134 are disposed inside a substantially planar metal-organic framework layer 132, the metal particles 134 may be disposed on a plane spaced apart from the first electrode 110 or the second electrode 150 by a predetermined distance in the first direction.

Referring to FIGS. 1 to 3, a diameter D of a metal particle 134, or the height of the metal particle along the z-direction on the first resistance change layer 120, may be substantially equal to or greater than the thickness t of the metal-organic framework layer 132. The metal particles 134 may penetrate through the metal-organic framework layer 132 in the z-direction and may come into contact with the first and second resistance change layers 120 and 140.

The metal-organic framework layer 132 may include at least two metal-organic frameworks. As illustrated in FIG. 3, metal-organic frameworks 132a, 132b, 132c, and 132d are stacked in a thickness direction (i.e., the z-direction). Although FIG. 3 illustrates first to fourth metal-organic frameworks 132a, 132b, 132c, and 132d as the at least two metal-organic frameworks, the present disclosure is not necessarily limited thereto, and various numbers of metal-organic frameworks may be utilized in the metal-organic framework layer 132.

Each of the first to fourth metal-organic frameworks 132a, 132b, 132c, and 132d may include a material of a two-dimensional structure having a plurality of cavities V, as illustrated in FIGS. 2 and 3. Here, the two-dimensional structure may refer to a structure in the form of a sheet disposed on a two-dimensional plane. FIG. 2 illustrates a representative metal-organic framework 132a, in which the cavities V may be arranged at regular intervals, and the width d of each of the cavities V may have, for example, a size of one nanometer (1 nm) to 100 nm. The first to fourth metal-organic frameworks 132a, 132b, 132c, and 132d may be made of the same material. Each of the first to fourth metal-organic frameworks 132a, 132b, 132c, and 132d may have an electrically insulating property.

Referring to FIG. 4, a metal-organic framework M according to an embodiment of the present disclosure may be a material in which metal-containing nodes Ma and organic ligands Mb are coordinated. The metal-containing node Ma may include, for example, a metal ion or a metal cluster. The metal may include, for example, zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), and the like.

The organic ligand Mb may include, for example, oxalic acid, fumaric acid, benzenehexathiol, triphenylenehexathiol, 1,4-benzene dicarboxylic acid, hexaaminobenzene, tetrakis(4-carboxyphenyl)-porphyrinato-cobalt(II), tetrakis(4-carboxyphenyl)-porphyrin, and the like. The organic ligand Mb may include, for another example, $H_2BDC$, $H_2BDC$-Br, $H_2BDC$-OH, $H_2BDC$-NO2, $H_2BDC$-$NH_2$, $H_4DOT$, $H_2BDC$—$(Me)_2$, $H_2BDC$—$(Cl)_2$, and the like.

The metal-organic framework M having a two-dimensional structure may have a porous structure that includes cavities V. The metal-organic framework M may have a physically and chemically stable two-dimensional network bonding structure. That is, in the metal-organic framework M, the coordination bond between the metal-containing node Ma and the organic ligand Mb may be regularly formed in two dimensions. As a result, a metal-organic framework M may exist in the form of a sheet with a nanoscale thickness.

Referring back to FIG. 3, in the metal-organic framework layer 132, the cavities V of the first to fourth metal-organic frameworks 132a, 132b, 132c, and 132d may be arranged to overlap and align with each other in the z-direction. The metal particles 134 may be disposed in inner spaces of the overlapping cavities V. Because the cavities V of the metal-organic framework layer 132 are arranged at regular intervals, the metal particles 134 may also be regularly arranged in the metal-organic framework layer 132.

The metal particles 134 may have a shape in which metal atoms are aggregated. In FIGS. 1, 2, and 3, the metal particles 134 are illustrated in a spherical shape, but is not necessarily limited thereto, and other three-dimensional shapes are possible.

In an embodiment, the width or diameter D of the metal particle 134 may have a size of, for example, 1 nm to 100 nm. In this case, the width or diameter D of the metal particle 134 may be substantially the same as or smaller than the width d of the cavity V. The metal particle 134 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mn), or a combination of two or more thereof. That is, as in a manufacturing method to be described later, the width or diameter D of the metal particle 134 may be determined by the width d of the cavity V of the metal-organic framework layer 132. Accordingly, the size of the metal particle 134 may be controlled or determined by controlling the width d of the cavity V of the metal-organic framework layer 132.

In FIG. 1, the first electrode 110 may be disposed on a substrate (not illustrated). The substrate may be any substrate that may be used in a semiconductor device manufacturing process. As an example, the substrate may include a semiconductor, an insulator, or a conductor.

As described above, a semiconductor device 1 according to an embodiment of the present disclosure may include first and second resistance layers 120 and 140 and a conduction control layer 130, which are disposed or layered between the first electrode 110 and the second electrode 150. The conduction control layer 130 may include conductive metal particles 134 arranged in cavities V of an insulating metal-organic framework layer 132. The metal particles 134 may be arranged to contact the first and second resistance layers 120 and 140. The metal particles 134 may control or determine the shape, density, distribution, and arrangement state of the conductive filaments formed inside the first and second resistance change layers 120 and 140 during a write operation of the semiconductor device 1.

Figure 5A:
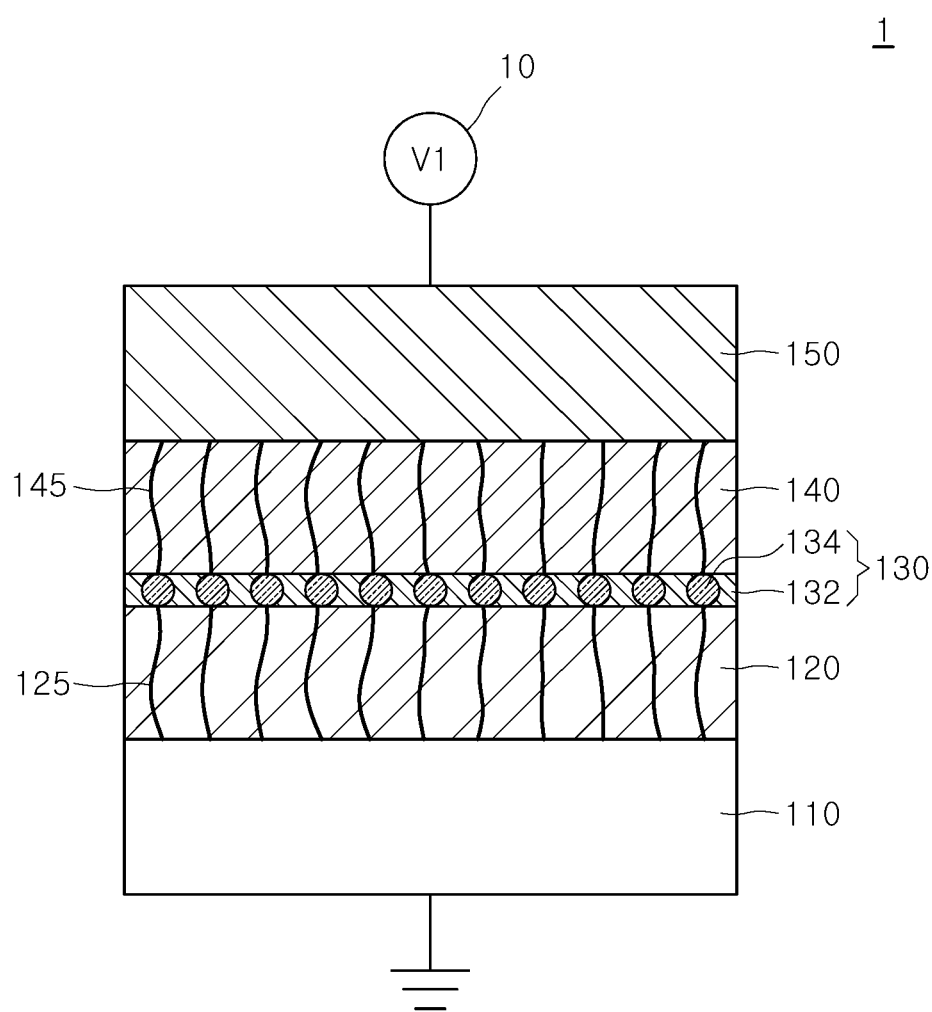
FIGS. 5A to 5C are views schematically illustrating an operation of a semiconductor device according to an embodiment of the present disclosure.
Figure 5B:
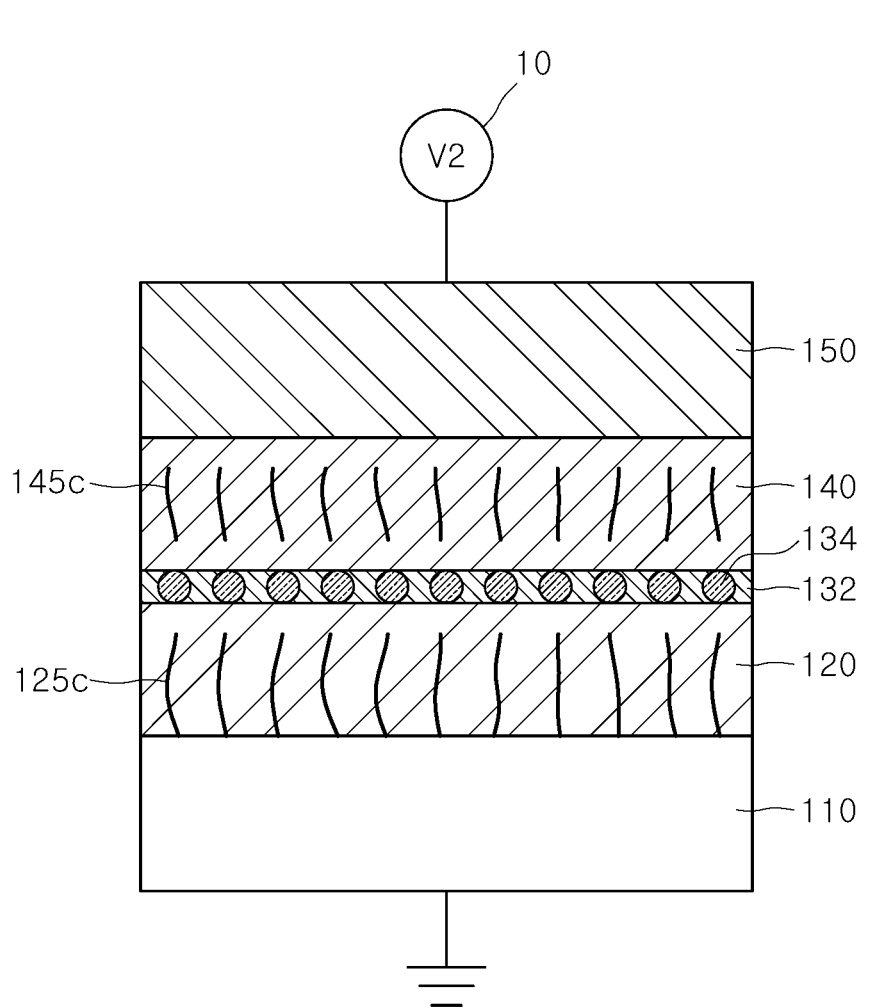
Figure 5C:
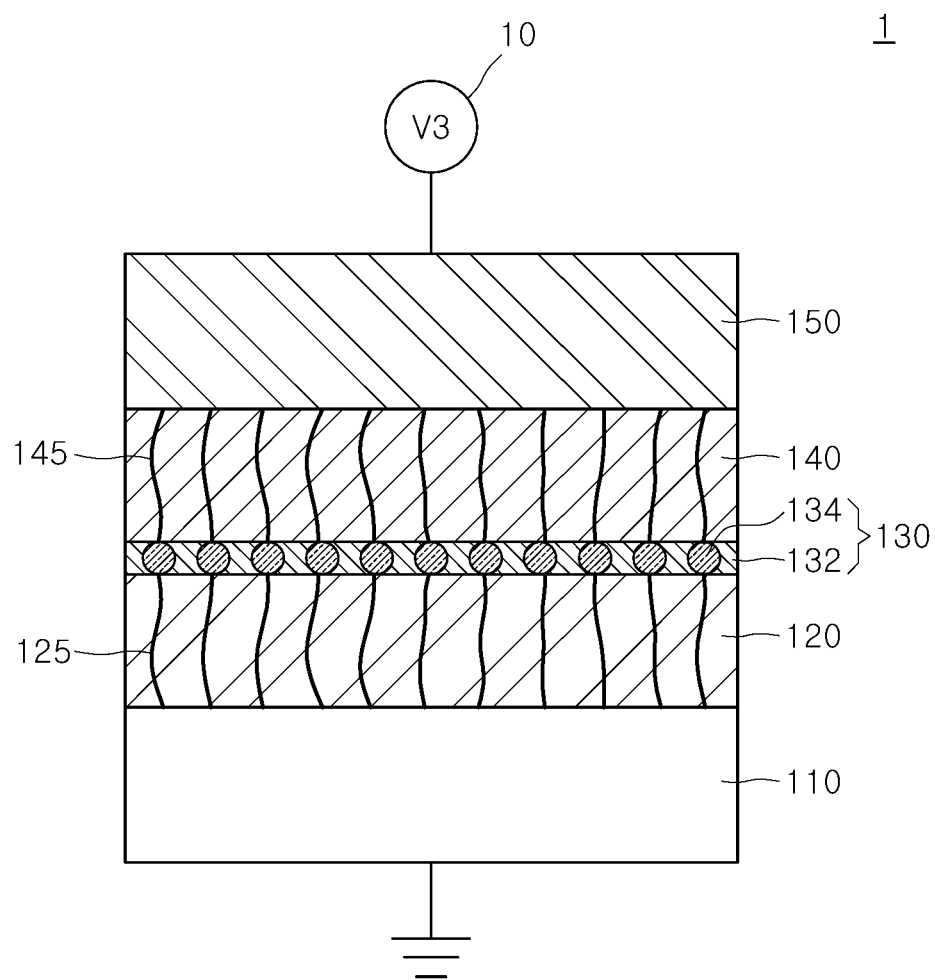

FIGS. 5A to 5C are views schematically illustrating an operation of a semiconductor device according to an embodiment of the present disclosure. The operation of the semiconductor device related to FIGS. 5A to 5C will be described using a semiconductor device 1 described with reference to FIG. 1.

Referring to FIG. 5A, a first write operation may be performed in a semiconductor device 1. Specifically, the first write operation may be performed by applying a first write voltage V1, supplied by a power supply 10, that is equal to or greater than a predetermined threshold voltage between the first electrode 110 and the second electrode 150 of the semiconductor device 1. The first write operation may be an operation that reduces the electrical resistance of the semiconductor device 1 by generating conductive filaments for the first time after the semiconductor device 1 is manufactured. That is, the first write operation may be referred to as a forming operation of the semiconductor device 1.

The method of applying the first write voltage V1 may be performed by applying a bias having a first polarity (e.g., positive polarity) to the second electrode 150 in a state where the first electrode 110 is grounded. By the application of the first write voltage V1, first and second conductive filaments 125 and 145 connecting the first and second electrodes 110 and 150 to each other may be formed in the first and second resistance change layers 120 and 140, respectively. As the first and second conductive filaments 125 and 145 connecting the first and second electrodes 110 and 150 are generated, conductive carriers may conduct between the first electrode 110 and the second electrode 150 through the first and second conductive filaments 125 and 145. Therefore, the electrical resistances of the first and second resistance change layers 120 and 140 may decrease. Even after the first write voltage V1 is removed, the first and second conductive filaments 125 and 145 may remain in the first and second resistance change layers 120 and 140, respectively. Accordingly, each of the first and second resistance change layers 120 and 140 may store the state in which the electrical resistance is reduced, that is, a low resistance state, as first signal information.

Referring to FIG. 5A, when the first write voltage V1 is applied, the conductive metal particles 134 may serve to concentrate an electric field, formed by the first write voltage V1, between the first resistance change layer 120 and the second resistance change layer 140. Because the metal particles 134 are arranged to be in contact with the first and second resistance change layers 120 and 140, the metal particles 134 may be connected to the first conductive filaments 125 generated in the first resistance change layer 120 and the second conductive filaments 145 generated in the second resistance change layer 140.

As described above with reference to FIGS. 1 to 4, the metal particles 134 may be regularly arranged inside the insulating metal-organic framework layer 132, and the size of the metal particle 134 may depend on the width of the cavity V. Accordingly, when performing the first write operation, the shape, density, and distribution of each of the first and second conductive filaments 125 and 145 may be controlled by the uniform distribution of the metal particles 134. Accordingly, the first and second conductive filaments 125 and 145 generated by the first write voltage V1 may be uniformly controlled, thereby improving reliability of the first write operation.

Referring to FIG. 5B, a second write operation may be performed in the semiconductor device 1. Specifically, using the power supply 10, the second write operation may be performed by applying a second write voltage V2 that is equal to or greater than a predetermined threshold voltage between the first electrode 110 and the second electrode 150. The second write operation may be an operation that removes or electrically disconnects at least a portion of each of the first and second conductive filaments 125 and 145 generated in the first and second resistance change layers 120 and 140 through the first write operation. That is, the second write operation may be referred to as a reset operation of the semiconductor device 1.

The method of applying the second write voltage V2 may be performed by applying a bias having a second polarity (e.g., negative polarity) to the second electrode 150 in a state where the first electrode 110 is grounded. By the application of the second write voltage V2, at least a portion of the first and second conductive filaments 125 and 145 may be removed. In an embodiment, the at least a portion of the first and second conductive filaments 125 and 145 may be removed by oxidizing the metal constituting the first and second conductive filaments 125 and 145 by the second write voltage V2 or by removing the oxygen cavities constituting the first and second conductive filaments 125 and 145 by the second write voltage V2. In another embodiment, the removal of the at least a portion of the first and second conductive filaments 125 and 145 may be due to Joule heat generated in the first and second conductive filaments 125 and 145 by the second write voltage V2.

Referring to FIG. 5B, as a result of the second write operation, at least portions of the first and second conductive filaments (125 and 145 of FIG. 5A) are removed. Electrically disconnected first and second conductive filaments 125*c* and 145*c* do not contact the metal particles 134 at an interface between the metal particles 134 and the first resistance change layer 120 and at an interface between the second resistance change layer 140 and the metal particles 134, respectively. In an embodiment, at least portions of the second conductive filaments 145*c* may be additionally removed at an interface between the second resistance change layer 140 and the second electrode 150. First and second conductive filaments 125*c* and 145*c* may be electrically disconnected at other portions not illustrated in FIG. 5B. As described above, through the disconnection of at least portions of the first and second conductive filaments 125*c* and 145*c*, the electrical resistances of the first and second resistance change layers 120 and 140 may increase. After the second write voltage V2 is removed, the electrically disconnected first and second conductive filaments 125*c* and 145*c* may remain in the first and second resistance change layers 120 and 140, however, each of the first and second resistance change layers 120 and 140 may store the increased electrical resistance state, that is, the high resistance state, as second signal information.

Referring to FIG. 5C, a third write operation may be performed in the semiconductor device 1. Specifically, using the power supply 10, the third write operation may be performed by applying a third write voltage V3 equal to or greater than a predetermined threshold voltage between the first electrode 110 and the second electrode 150. The third write operation may be an operation that reconnects the disconnected portions of the first and second conductive filaments 125*c* and 145*c* existing in the first and second resistance change layers 120 and 140 by the second write operation. The third write operation may electrically connect the first electrode 110 and the second electrode 150 through first and second conductive filaments 125 and 145 and metal particles 134 as shown in FIG. 5C. The third write operation may be referred to as a set operation of the semiconductor device 1. Through the set operation, the electrical resistances of the first and second resistance change layers 120 and 140 may be reduced.

The third write voltage V3 may apply a bias having the first polarity (e.g., positive polarity) to the second electrode 150 in a state where the first electrode 110 is grounded. The magnitude of the third voltage V3 may be smaller than the first write voltage V1 of FIG. 5A.

By the application of the third write voltage V3, the disconnected portions of the first and second conductive filaments (125*c* and 145*c* of FIG. 5B) may be recovered or re-formed, and the first electrode 110 and the second electrode 150 may be connected by the first and second conductive filaments 125 and 145. The first and second conductive filaments 125 and 145 may be in contact with the metal particles 134. Even after the third write voltage V3 is removed, the first and second conductive filaments 125 and 145 may remain in the first and second resistance change layers 120 and 140, respectively. Accordingly, each of the first and second resistance change layers 120 and 140 may store the state in which the electrical resistance is reduced, that is, the first signal information.

Figure 6:
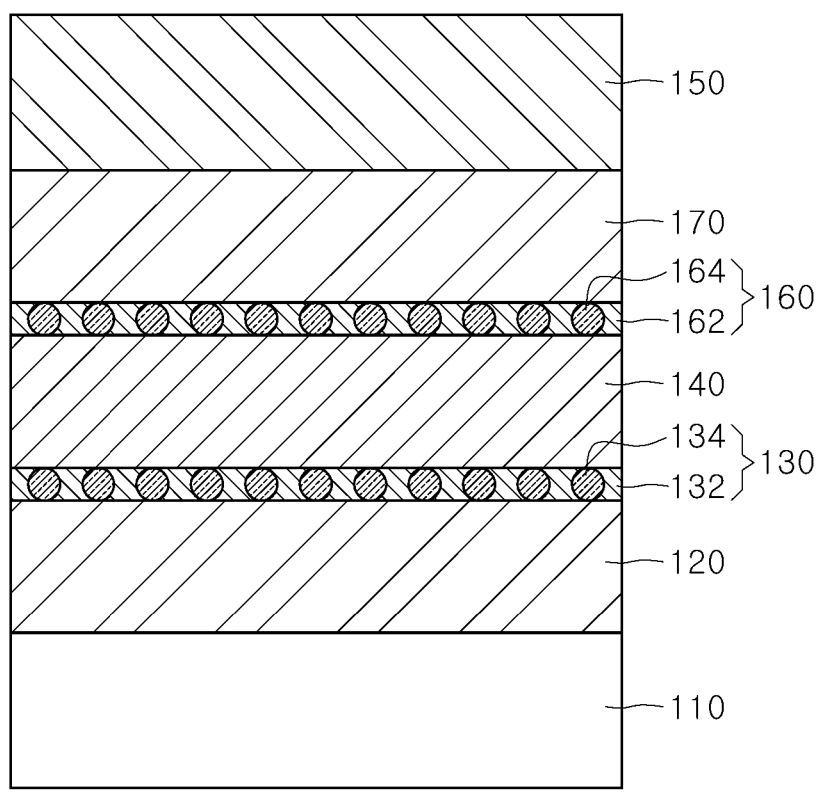
FIG. 6 is a cross-sectional view schematically illustrating a semiconductor device according to another embodiment of the present disclosure.

FIG. 6 is a cross-sectional view schematically illustrating a semiconductor device according to another embodiment of the present disclosure. Referring to FIG. 6, the semiconductor device 2 may further include a conductive control layer 160 and a resistance change layer 170 between a second resistance change layer 140 and a second electrode 150, compared to the semiconductor device 1 of FIG. 1.

Referring to FIG. 6, a semiconductor device 2 may include first to third resistance change layers 120, 140, and 170 between a first electrode 110 and the second electrode 150. A first conduction control layer 130 may be disposed between the first resistance change layer 120 and the second resistance change layer 140, and the second conduction control layer 160 may be disposed between the second resistance change layer 140 and the third resistance change layer 170.

The materials, structures, and electrical properties of the third resistance change layer 170 may be substantially the same as the materials, structures, and electrical properties of each of the first and second resistance change layers 120 and 140 described with reference to FIG. 1. The materials, structures, and electrical properties of the second conduction control layer 160 may be substantially the same as the materials, structures, and electrical properties of the conduction control layer 130 described with reference to FIG. 1.

Compared to a semiconductor device 1, a semiconductor device 2 of FIG. 6 may further include a third resistance change layer 170. Accordingly, the total thickness of the resistance change layers of the semiconductor device 2 (i.e., the sum of the thicknesses of the first to third resistance change layers 120, 140, and 170) may be greater than the total thickness of the resistance change layers of the semiconductor device 1 (i.e., the sum of the thicknesses of the first and second resistance change layers 120 and 140). Accordingly, the semiconductor device 2 may further include the second conduction control layer 160 that corresponds to the increased overall thickness of the resistance change layers. As a result, it is possible to more precisely control the shape, density, distribution, and arrangement state of the conductive filaments respectively generated in the first to third resistance change layers 120, 140, and 170 in response to the increased thickness.

In some embodiments not illustrated in FIG. 2, the distance between the first electrode 110 and the and second electrode 150 may be fixed, and the number of the plurality of resistance change layers disposed within the distance may be increased. Accordingly, the number of conduction control layers disposed between the plurality of resistance change layers may be increased to correspond to an increase in the number of resistance change layers.

As the number of the plurality of resistance change layers increases, the thickness of each of the plurality of resistance change layers may be decrease. Accordingly, the length of the conductive filaments formed inside each of the plurality of resistance change layers between the plurality of conduction control layers may be shortened. As the length of the conductive filament is shortened, the shape, density, and arrangement state of the conductive filament may be more precisely controlled.

FIGS. 7 to 10 are cross-sectional views schematically illustrating a method of manufacturing a semiconductor device according to an embodiment of the present disclosure. FIGS. 11A, 11B, 12A, and 12B are views schematically illustrating a method of forming a conduction control layer of a semiconductor device according to an embodiment of the present disclosure.

Figure 7:
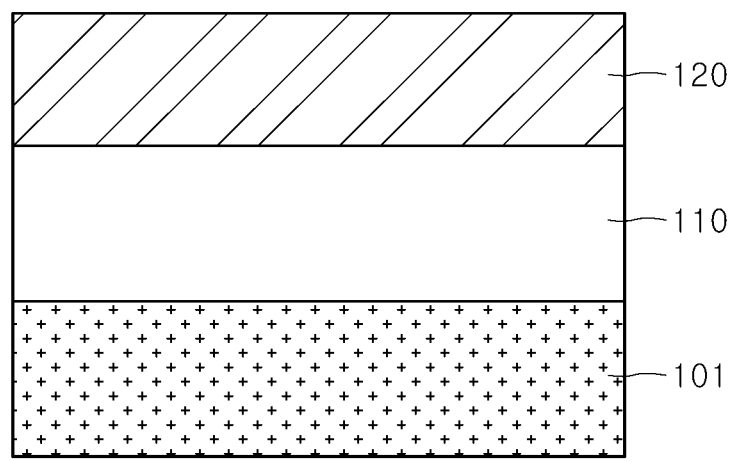
FIGS. 7 to 10 are cross-sectional views schematically illustrating a method of manufacturing a semiconductor device according to an embodiment of the present disclosure.

Referring to FIG. 7, a substrate 101 may be provided. The substrate 101 may be any type of substrate used in a semiconductor device manufacturing process. As an example, the substrate 101 may include a semiconductor, an insulator, or a conductor.

Next, a first electrode 110 may be formed on the substrate 101. The first electrode 110 may include a conductive material. The conductive material may include, for example, doped semiconductor, metal, conductive metal nitride, conductive metal carbide, conductive metal silicide, or conductive metal oxide. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first electrode 110 may be formed by using, for example, a sputtering method, a chemical vapor deposition method, or an atomic layer deposition method.

Next, a first resistance change layer 120 may be formed on the first electrode 110. The first resistance change layer 120 may include a resistance change material. The resistance change material may include metal oxide, such as titanium oxide, aluminum oxide, nickel oxide, copper oxide, zirconium oxide, manganese oxide, hafnium oxide, tungsten oxide, tantalum oxide, niobium oxide, iron oxide. As another example, the resistance change material may include a perovskite material, such as PCMO($Pr_{0.7}Ca_{0.3}MnO_3$), LCMO($La_{1-x}Ca_xMnO_3$), BSCFO($Ba_{0.5}Sr_{0.5}Co_{0.8}Fe_{0.2}O_{3-\delta}$), YBCO($YBa_2Cu_3O_{7-x}$), (Ba,Sr)$TiO_3$(Cr, Nb-doped), $SrZrO_3$ (Cr,V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the like. As further examples, the resistance change material may include a selenide-based material, such as $Ge_xSe_{1-x}$(Ag,Cu,Te-doped), or a metal sulfide, such as $Ag_2S$, $Cu_2S$, CdS, ZnS, and the like. The first resistance change layer 120 may be formed by using, for example, a chemical vapor deposition method, or an atomic layer deposition method.

Figure 8:
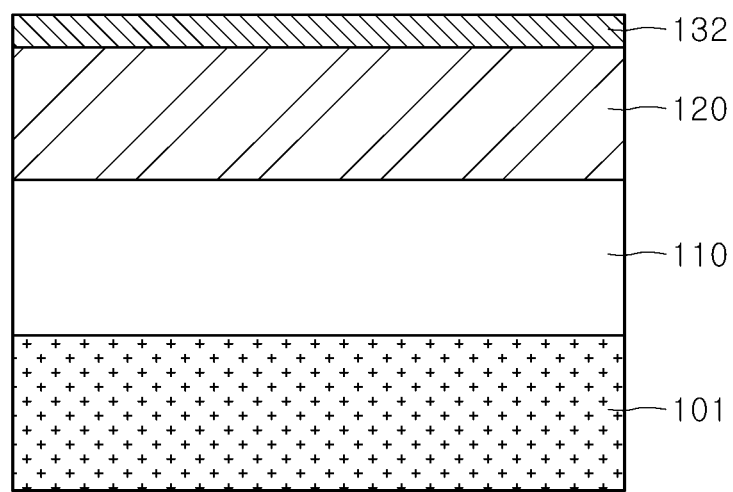
Figure 9:
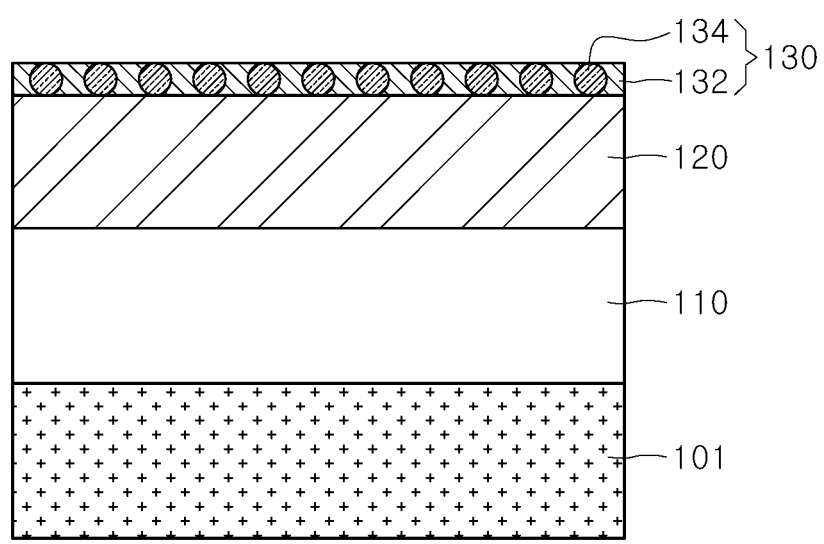
Figure 11A:
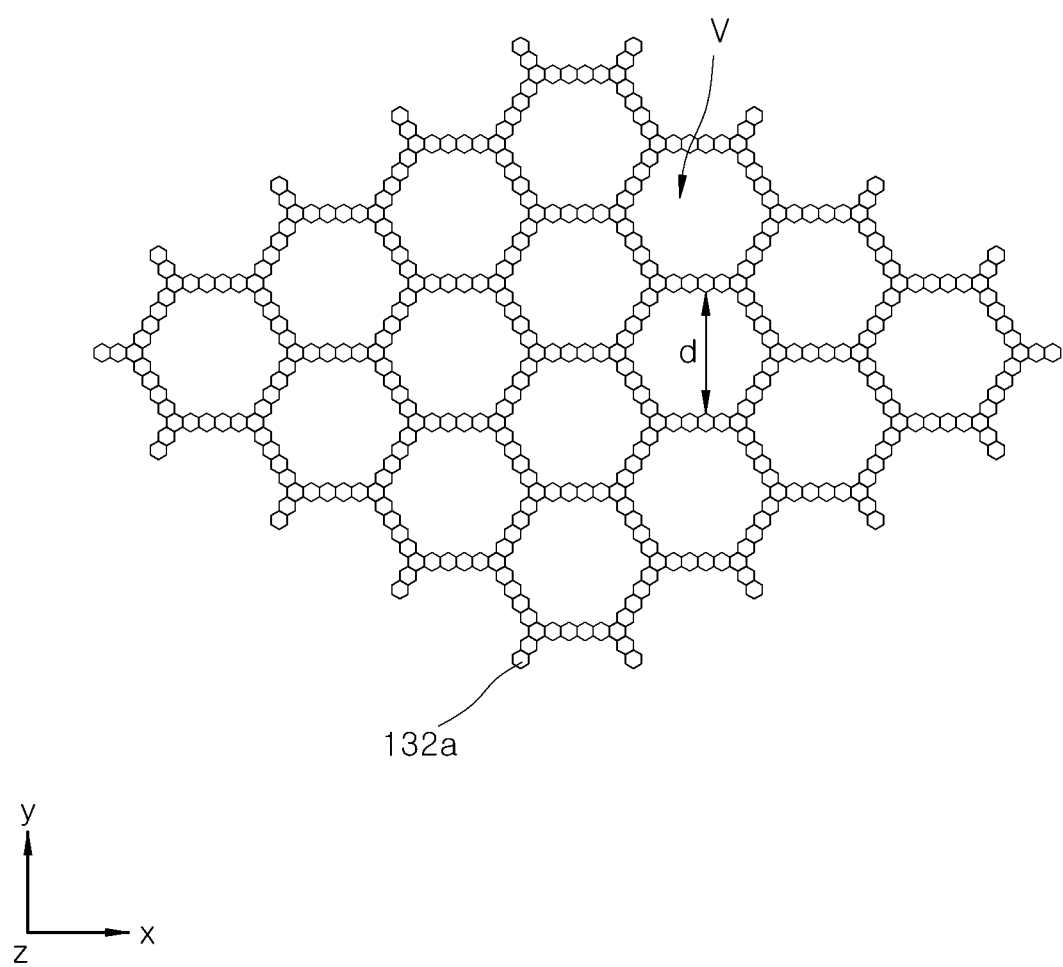
FIGS. 11A, 11B, 12A, and 12B are views schematically illustrating a method of forming a conduction control layer of a semiconductor device according to an embodiment of the present disclosure.
Figure 11B:
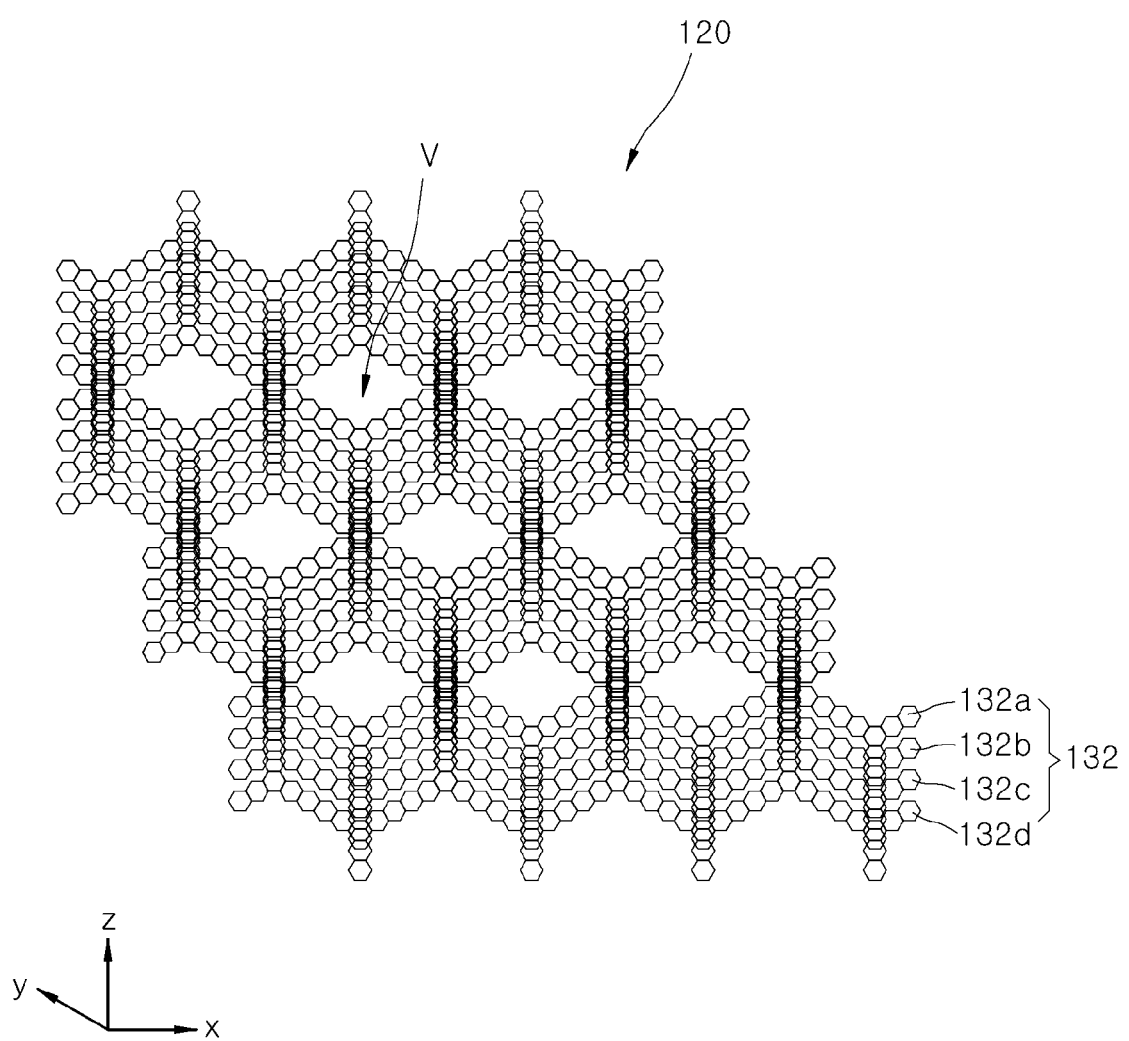

Referring to FIG. 8, a metal-organic framework layer 132 may be formed on the first resistance change layer 120. The metal-organic framework layer 132 may be formed by sequentially stacking a plurality of metal-organic frameworks 132a, 132b, 132c, and 132d, as illustrated in FIGS. 11A and 11B. Each of the plurality of metal-organic frameworks 132a, 132b, 132c, and 132d may have a two-dimensional structure that includes cavities V. The cavities V of the plurality of metal-organic frameworks 132a, 132b, 132c, and 132d may align and overlap with each other. FIG. 11A is a schematic plan view illustrating a metal-organic framework 132a, and FIG. 11B is a schematic perspective view illustrating the metal-organic framework layer 132.

Each of the plurality of metal-organic frameworks 132a, 132b, 132c, and 132d may include a metal node and organic ligands coupled to the metal node. As an embodiment, each of the metal-organic frameworks 132a, 132b, 132c, and 132d may be a metal-organic framework M described above with reference to FIG. 4.

In an embodiment, the metal-organic framework layer 132 may be formed through a deposition method using a first precursor including metal constituting the metal node and a second precursor including the organic ligand. The deposition method may include, for example, an atomic layer deposition method or a chemical vapor deposition method. In this case, a first metal-organic framework may be formed on the first resistance change layer 120 through the deposition method, and then, the deposition method may be performed on the first metal-organic framework to form a second metal-organic framework. As described above, the metal-organic framework layer 132 may be formed by sequentially stacking the metal-organic frameworks by the deposition method.

In another embodiment, the process of forming the metal-organic framework layer 132 may include a process of preparing a first precursor including metal constituting the metal node and a second precursor including the organic ligand, a process of synthesizing the metal-organic framework using the first precursor and the second precursor, and a process of coating the synthesized metal-organic framework on the first resistance change layer 120. The process of synthesizing the metal-organic framework may be performed in a solution state or a vapor state.

Referring to FIGS. 11A and 11B, each of the plurality of metal-organic frameworks 132a, 132b, 132c, and 132d may have a two-dimensional structure including cavities V arranged at regular intervals. The width d of the cavity V may be determined by a material constituting the metal node and the organic ligand. The width d of the cavity V may have a size of 1 nm to 100 nm, for example.

Figure 12A:
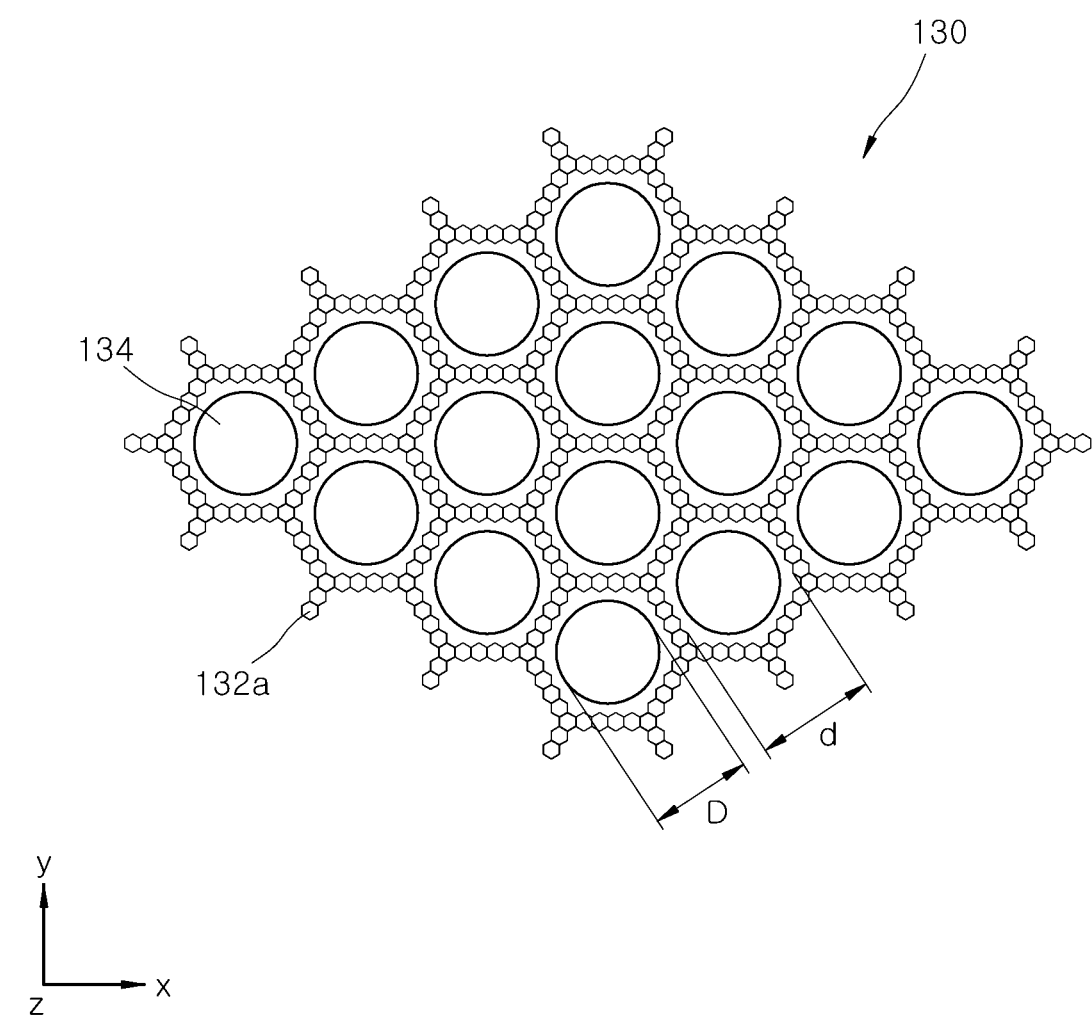
Figure 12B:
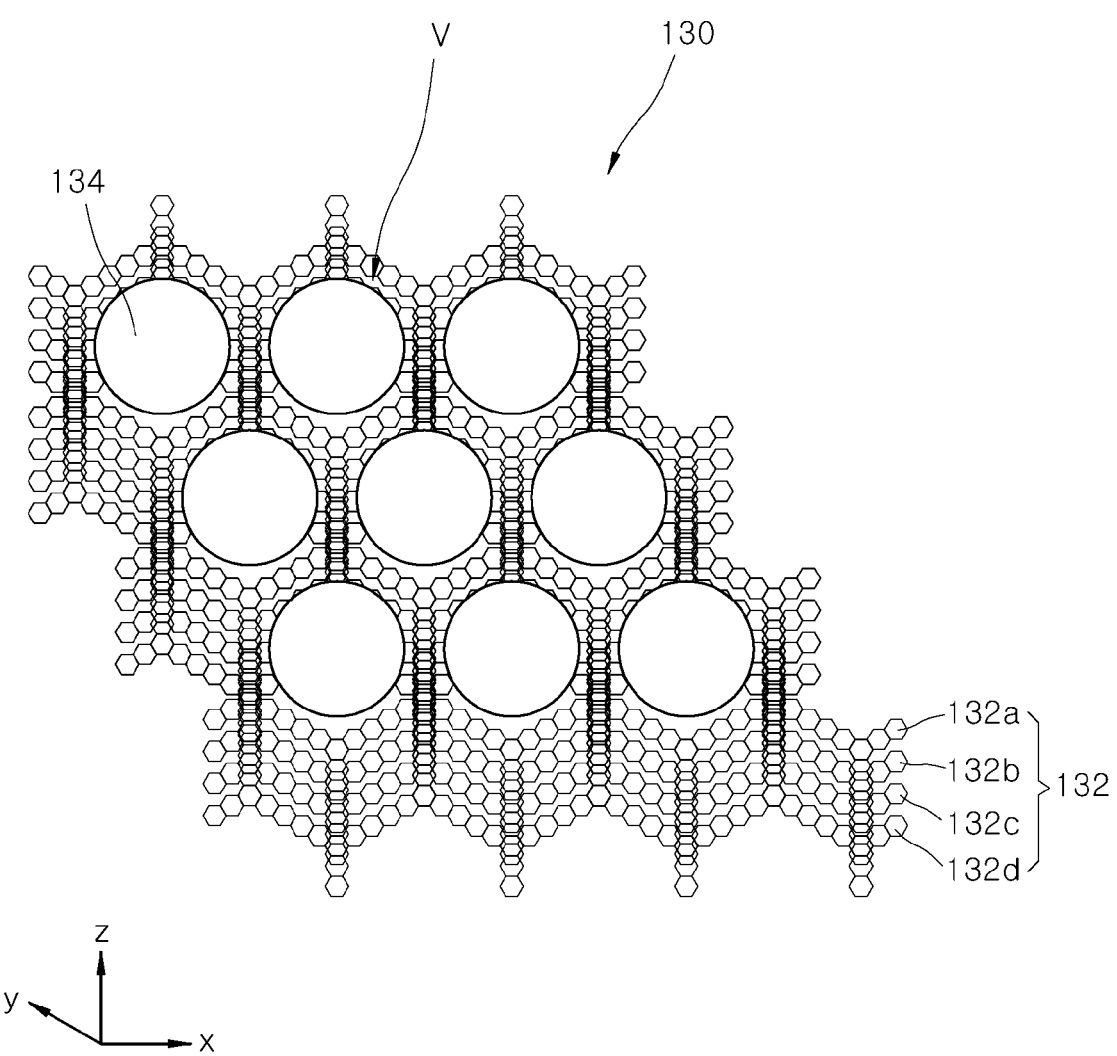

Referring back to FIG. 9, a conduction control layer 130 may be formed by arranging metal particles 134 inside the metal-organic framework layer 132. In an embodiment, as illustrated in FIGS. 12A and 12B, a conduction control layer 130 may be formed by arranging the metal particles 134 inside the overlapping cavities V of the plurality of metal-organic frameworks 132a, 132b, 132c, and 132d. FIG. 12A is a schematic plan view illustrating the conduction control layer 130, and FIG. 12B is a schematic perspective view illustrating the conduction control layer 130.

In an embodiment, the process of forming the conduction control layer 130 may include a process of providing a precursor including metal to the metal-organic framework layer 132, and a process of reducing the metal of the precursor to grow the metal into the metal particles 134 within the inner spaces of the overlapping cavities V of the metal-organic framework layer 132.

In another embodiment, the process of forming the conduction control layer 130 may include a process of depositing a metal layer to fill the inner spaces of the overlapping cavities V of the metal-organic framework layer 132 on the first resistance change layer 120, and a process of forming the metal particles 134 by removing portions of the metal layer deposited outside the cavities V. The process of removing the portions of the metal layer may be performed by, for example, polishing.

The metal particles 134 formed by the above-described method may have any shape in which metal atoms are aggregated. The metal particles 134 may have various three-dimensional shapes. In an embodiment, the diameter D of the metal particle 124 having a spherical shape may have a size of, for example, 1 nm to 100 nm. The diameter D of the metal particle 134 may be substantially equal to or smaller than the width d of the cavity V. Accordingly, the metal particles 134 may be disposed inside the cavities V, and may be regularly arranged in the metal-organic framework layer 132. The metal particles 134 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mn), or a combination of two or more thereof.

Figure 10:
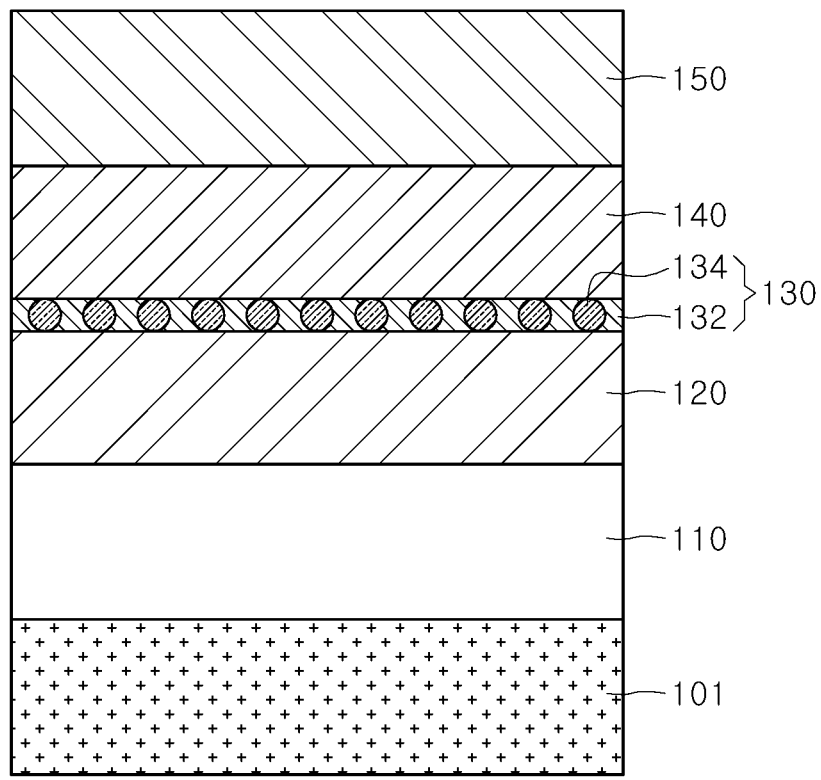

Referring to FIG. 10, a second resistance change layer 140 may be formed on the conduction control layer 130. The materials, structures, and electrical properties of the second resistance change layer 140 may be substantially the same as the materials, structures, and electrical properties of the first resistance change layer 120. In an embodiment, the first and second resistance change layers 120 and 140 may be formed of substantially the same material. The second resistance change layer 140 may be formed by using, for example, a chemical vapor deposition method or an atomic layer deposition method.

Next, a second electrode 150 may be formed on the second resistance change layer 140. The materials, structures, and electrical properties of the second electrode 150 may be substantially the same as the materials, structures, and electrical properties of the first electrode 110. In an embodiment, the first and second electrodes 110 and 150 may be formed of substantially the same material. The second electrode 150 may be formed by, for example, using a chemical vapor deposition method or an atomic layer deposition method. Semiconductor devices according to embodiments of the present disclosure may be manufactured using the above-described methods, and the processes may be repeated in semiconductor devices with additional resistance change layers and conduction control layers between the electrode layers.

Figure 13A:
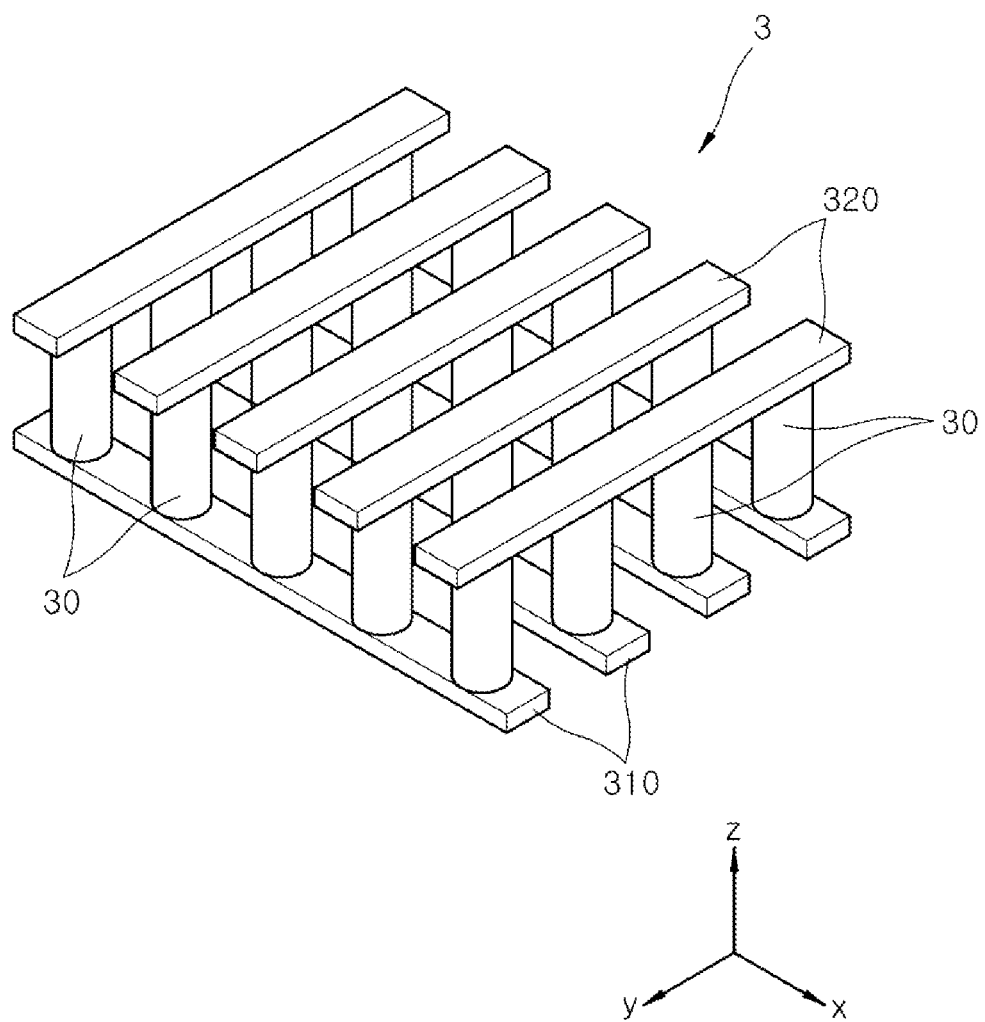
FIG. 13A is a perspective view schematically illustrating a semiconductor device according to another embodiment of the present disclosure.
Figure 13B:
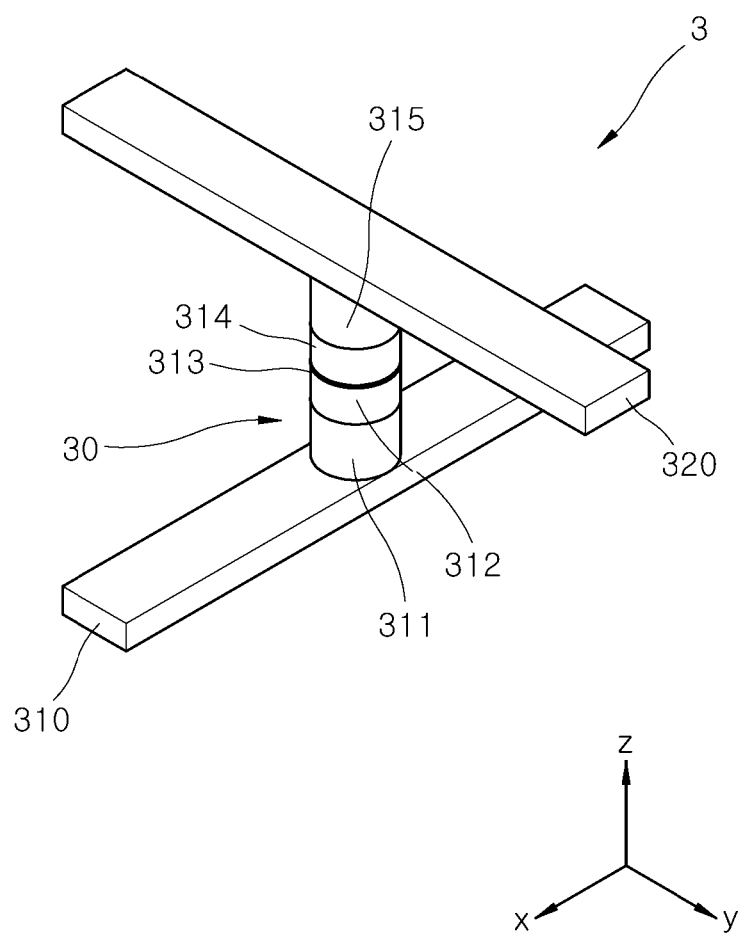
FIG. 13B is a partially enlarged view of a semiconductor device of FIG. 13A.

FIG. 13A is a perspective view schematically illustrating a semiconductor device according to another embodiment of the present disclosure. FIG. 13B is a partially enlarged view of a semiconductor device 3 of FIG. 13A.

Referring to FIGS. 13A and 13B, a semiconductor device 3 may be a cross-point array device. The semiconductor device 3 may include a plurality of first conductive lines 310 and a plurality of second conductive lines 320, and pillar structures 30 arranged in areas or regions where the first and second conductive lines 310 and 320 intersect. The first conductive lines 310 and the second conductive lines 320 may be disposed on different planes. As illustrated in FIG. 13B, each of the pillar structures 30 may include a first resistance change layer 312, a conduction control layer 313, and a second resistance change layer 314.

Referring to FIG. 13A, in the semiconductor device 3, the plurality of first conduction lines 310 may be arranged in the y-direction, and the plurality of second conduction lines 320 may be arranged in the x-direction. The plurality of pillar structures 30 may be arranged in areas or regions where the first and second conductive lines 310 and 320 intersect. The plurality of pillar structures 30 may extend along the z-direction. In FIGS. 13A and 13B, the x-direction and the y-direction are illustrated as a Cartesian coordinate system in which the x-direction and the y-direction are orthogonal to each other, but the present disclosure is not limited thereto, and various modifications may exist as long as the x-direction and the y-direction are not parallel. In a plan view, the pillar structures 30 may form a plurality of arrays arranged in the x-direction and the y-direction. Each of the plurality of pillar structures 30 may constitute a memory cell of the semiconductor device 3. The first and second conduction lines 310 and 320 may be signal lines of the semiconductor device 3, and may be line-type conductive layers.

Referring to FIG. 13B, the pillar structure 30 may include a first electrode layer 311 disposed on a first conduction line 310, a first resistance change layer 312 disposed on the first electrode layer 311, a conduction control layer 313 disposed on the first resistance change layer 312, a second resistance change layer 314 disposed on the conduction control layer 313, and a second electrode layer 315 disposed on the second resistance change layer 314.

The materials and electrical properties of each of the first electrode layer 311, the first resistance change layer 312, the conduction control layer 313, the second resistance change layer 314, and the second electrode layer 315 may be substantially the same as the materials and electrical properties of each of the first electrode layer 110, the first resistance change layer 120, the conduction control layer 130, the second resistance change layer 140, and the second electrode layer 150 of the semiconductor device of FIG. 1, respectively.

As described above, a semiconductor device according to an embodiment of the present disclosure may be implemented as a cross-point array device including arrays of a plurality of memory cells.

Figure 14A:
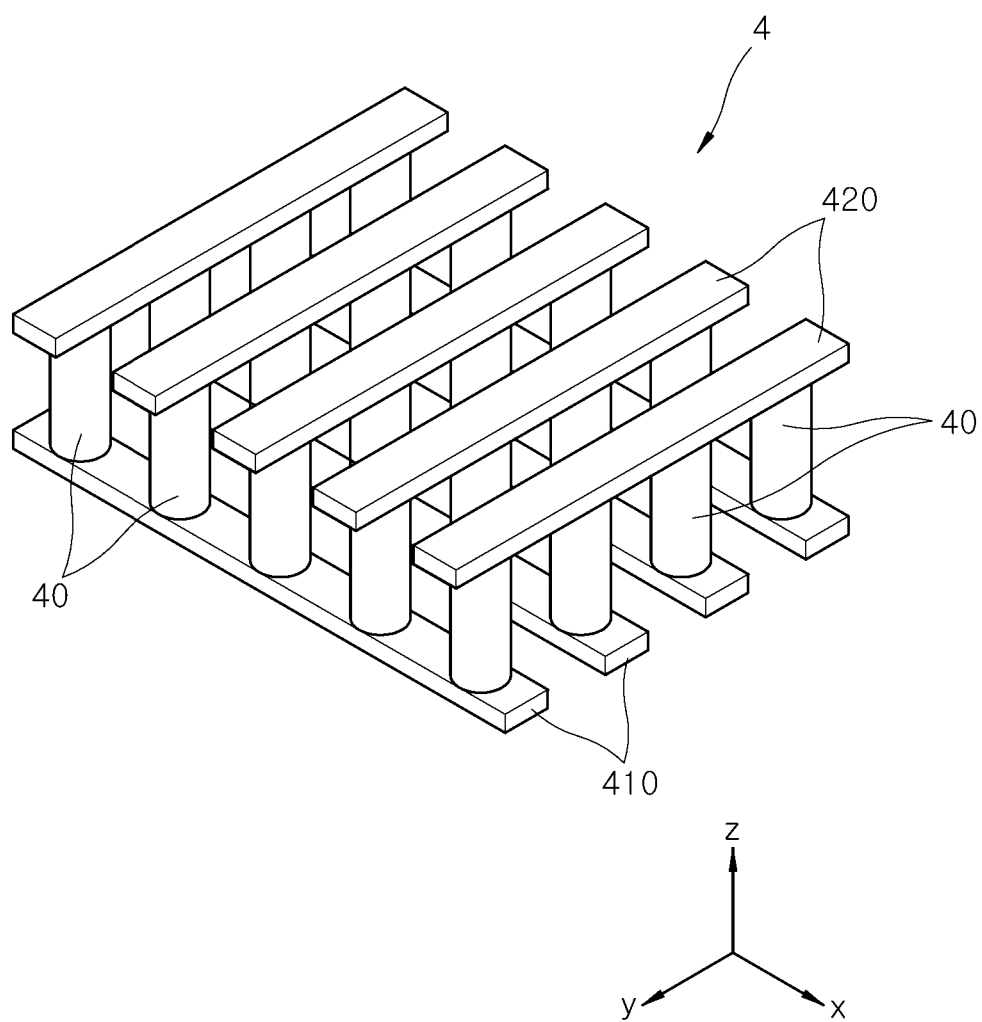
FIG. 14A is a perspective view schematically illustrating a semiconductor device according to another embodiment of the present disclosure.
Figure 14B:
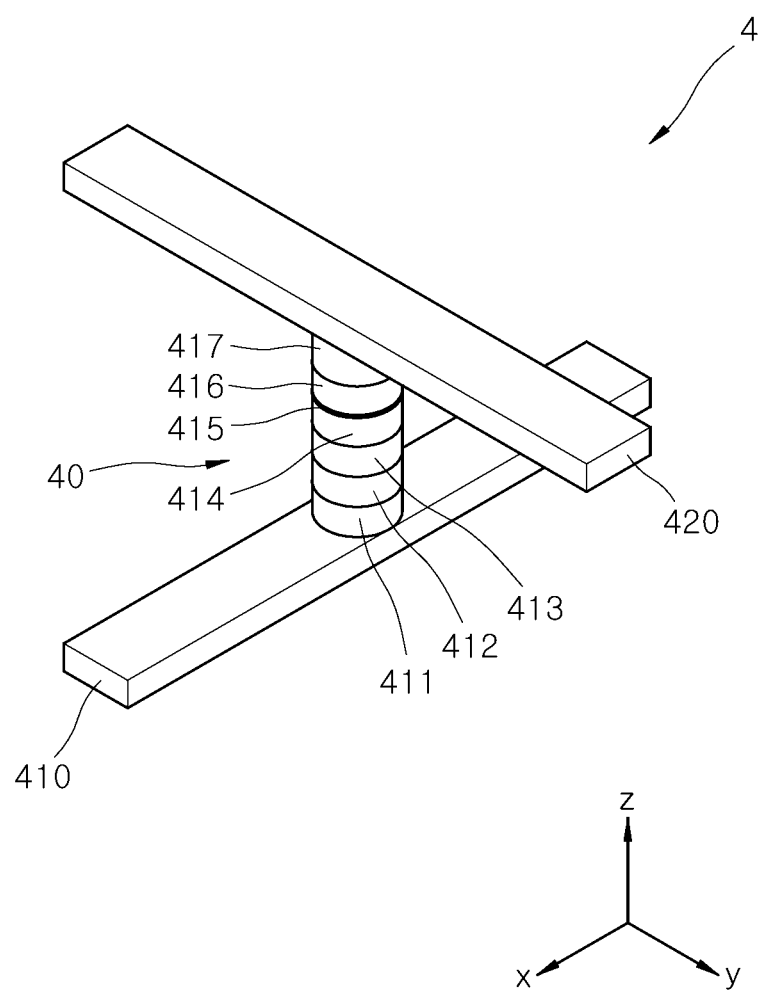
FIG. 14B is a partially enlarged view of a semiconductor device of FIG. 14A.

FIG. 14A is a perspective view schematically illustrating a semiconductor device according to another embodiment of the present disclosure. FIG. 14B is a partially enlarged view of a semiconductor device of FIG. 14A. Referring to FIGS. 14A and 14B, a semiconductor device 4 may further include a selection element as compared to a semiconductor device 3 of FIGS. 13A and 13B.

Referring to FIG. 14A, the semiconductor device 4 may include a plurality of first conduction lines 410 and a plurality of second conduction lines 420, and pillar structures 40 arranged in areas or regions where the first and second conduction lines 410 and 420 intersect. The first conduction lines 410 and the second conduction lines 420 may be disposed on different planes. As illustrated in FIG. 14B, each of the pillar structures 40 may include a first electrode layer 413, a first resistance change layer 414, a conduction control layer 415, a second resistance change layer 416, and a second electrode layer 417. The materials, structures, and electrical properties of each of the first electrode layer 413, the first resistance change layer 414, the conduction control layer 415, the second resistance change layer 416, and the second electrode layer 417 may be substantially the same as the materials, structures, and electrical properties of the first electrode layer 311, the first resistance change layer 312, the conduction control layer 313, the second resistance change layer 314, and the second electrode layer 315 of FIGS. 13A and 13B, respectively.

Referring to FIG. 14B, the semiconductor device 4 may further include a selection element electrode 411 and a selection element layer 412 disposed between a first conduction line 410 and a first electrode layer 413. The selection element electrode 411 may include a conductive material. The conductive material included in the selection element electrode 411 may be substantially the same as the conductive material included in the first electrode layer 413.

The selection element layer 412 may be a switching layer that performs a threshold switching operation, and may reduce leakage current introduced from neighboring pillar structures when the cross-point array device is driven.

The selection element layer 412 may include, for example, silicon oxide, silicon nitride, metal oxide, metal nitride, or a combination of two or more thereof. As an example, the selection element layer 412 may include, for example, aluminum oxide, zirconium oxide, hafnium oxide, tungsten oxide, titanium oxide, nickel oxide, copper oxide, manganese oxide, tantalum oxide, niobium oxide, iron oxide, or a combination of two or more thereof.

As described above, semiconductor devices according to embodiments of the present disclosure may be implemented as a cross-point array device including arrays of memory cells that additionally include selection element layers performing threshold switching.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
    a first electrode;
    a first resistance change layer disposed on the first electrode;
    a conduction control layer disposed on the first resistance change layer and including a metal-organic framework layer and metal particles embedded in the metal-organic framework layer;
    a second resistance change layer disposed on the conduction control layer; and
    a second electrode disposed on the second resistance change layer.

2. The semiconductor device of claim 1, wherein the metal-organic framework layer has an insulating property.

3. The semiconductor device of claim 1, wherein the metal-organic framework layer includes a metal-organic framework of a two-dimensional structure that includes regularly arranged cavities.

4. The semiconductor device of claim 3,
    wherein the metal-organic framework layer includes at least two metal-organic frameworks,
    wherein the cavities of the at least two metal-organic frameworks are disposed to overlap with each other, and
    wherein the metal particles are disposed in inner spaces of the overlapping cavities.

5. The semiconductor device of claim 4, wherein a width of the metal particle is equal to or less than a width of the cavity.

6. The semiconductor device of claim 1, wherein a height of the metal particle on the first resistance change layer is substantially the same as or greater than a thickness of the metal-organic framework layer.

7. The semiconductor device of claim 1, wherein the metal particle includes at least one selected from the group consisting of cobalt (Co), nickel (Ni), copper (Cu), iron (Fe), platinum (Pt), gold (Au), silver (Ag), iridium (Ir), ruthenium (Ru), palladium (Pd), and manganese (Mn).

8. The semiconductor device of claim 1, wherein the metal particles are regularly arranged in the metal-organic framework layer.

9. The semiconductor device of claim 1, wherein the metal particles are arranged on a plane spaced apart from the first electrode or the second electrode by a predetermined distance.

10. The semiconductor device of claim 1, wherein the metal particles are arranged to contact the first and second resistance change layers.

11. The semiconductor device of claim 1, further comprising conductive filaments that are in contact with the metal particles and that extend through the first and second resistance change layers.

12. The semiconductor device of claim 1, further comprising a first conductive filament disposed in the first resistance change layer and a second conductive filament disposed in the second resistance change layer,
    wherein the first and second conductive filaments are not in contact with the metal particles.

13. The semiconductor device of claim 1, wherein the first and second resistance change layers are formed of substantially the same material.

14. The semiconductor device of claim 1, further comprising:
   another conduction control layer and a third resistance change layer disposed between the second resistance change layer and the second electrode,
   wherein the another conduction control layer is disposed on the second resistance change layer; and
   wherein the third resistance change layer is disposed on the another conduction control layer.

15. A method of manufacturing a semiconductor device, the method comprising:
   providing a substrate;
   forming a first electrode on the substrate;
   forming a first resistance change layer on the first electrode;
   forming, on the first resistance change layer, a conduction control layer including an insulating metal-organic framework layer and metal particles embedded in the metal-organic framework layer;
   forming a second resistance change layer on the conduction control layer; and
   forming a second electrode on the second resistance change layer.

16. The method of claim 15, wherein forming the conduction control layer comprises:
   forming a metal-organic framework having a two-dimensional structure and including cavities;
   stacking a plurality of metal-organic frameworks to form the insulating metal-organic framework layer, the cavities of the metal-organic frameworks overlapping with each other; and
   arranging the metal particles in inner spaces of the overlapping cavities.

17. The method of claim 16, wherein forming the metal-organic framework comprises performing an atomic layer deposition method or a chemical vapor deposition method using a first precursor and a second precursor, the first precursor including metal constituting a metal node and a second precursor including an organic ligand.

18. The method of claim 16, wherein forming the metal-organic framework comprises performing a synthesis operation using a first precursor and a second precursor, the first precursor including metal constituting a metal node and a second precursor including an organic ligand.

19. The method of claim 16, wherein arranging the metal particles comprises:
   providing a precursor including metal to the insulating metal-organic framework layer;
   reducing the metal of the precursor in the insulating metal-organic framework layer; and
   growing the reduced metal into the metal particles in the inner space of the overlapping cavities of the insulating metal-organic framework layer.

20. The method of claim 16, wherein arranging the metal particles comprises:
   depositing a metal layer filling the inner space of the overlapping cavities of the metal-organic framework layer; and
   removing portions of the metal layer located outside the cavities.

21. A semiconductor device comprising:
   a first conduction line and a second conduction line that are disposed on different planes; and
   a pillar structure disposed in a region that the first conduction line and the second conduction line intersect, the pillar structure including a first resistance change layer, a conduction control layer, and a second resistance change layer,
   wherein the conduction control layer includes a metal-organic framework layer and metal particles embedded in the metal-organic framework layer.

22. The semiconductor device of claim 21, wherein the conduction control layer is disposed between the first resistance change layer and the second resistance change layer.

23. The semiconductor device of claim 21, wherein the metal-organic framework layer has an insulating property.

24. The semiconductor device of claim 21, wherein the metal-organic framework layer includes a metal-organic framework having a two-dimensional structure and the metal-organic framework includes regularly arranged cavities.

25. The semiconductor device of claim 24,
   wherein the metal-organic framework layer includes at least two metal-organic frameworks,
   wherein the cavities of the at least two metal-organic frameworks are disposed to overlap with each other, and
   wherein the metal particles are disposed in inner spaces of the overlapping cavities.

26. The semiconductor device of claim 24, wherein the metal particles are disposed to contact the first and second resistance change layers.

27. The semiconductor device of claim 21, further comprising:
   a first electrode disposed between the first conduction line and the first resistance change layer; and
   a second electrode disposed between the second conduction line and the second resistance change layer.

28. The semiconductor device of claim 21, further comprising a selection element disposed between the first conduction line and the first resistance change layer or between the second conduction line and the second resistance change layer.

* * * * *